United States Patent
Wirth et al.

(10) Patent No.: US 9,444,239 B2
(45) Date of Patent: Sep. 13, 2016

(54) BAR FOR ELECTRONICALLY CONTACTING AN ELECTRICALLY CONDUCTIVE SUBSTRATE

(75) Inventors: Harry Wirth, Merzhausen (DE); Johann Walter, Freiburg (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 205 days.

(21) Appl. No.: 13/979,009

(22) PCT Filed: Jan. 3, 2012

(86) PCT No.: PCT/EP2012/000012
§ 371 (c)(1),
(2), (4) Date: Aug. 19, 2014

(87) PCT Pub. No.: WO2012/095275
PCT Pub. Date: Jul. 19, 2012

(65) Prior Publication Data
US 2014/0347087 A1    Nov. 27, 2014

(30) Foreign Application Priority Data
Jan. 11, 2011    (DE) .......... 10 2011 008 261

(51) Int. Cl.
*H02G 5/02*    (2006.01)
*G01R 31/26*    (2014.01)
(Continued)

(52) U.S. Cl.
CPC .......... *H02G 5/02* (2013.01); *G01R 1/07342* (2013.01); *H02S 50/10* (2014.12); *Y10T 29/49117* (2015.01)

(58) Field of Classification Search
CPC .......... H02G 5/02; G01R 31/2605
USPC .......... 324/761.01
See application file for complete search history.

(56) References Cited

U.S. PATENT DOCUMENTS 4,520,314 A * 5/1985 Asch .......... G01R 1/073
324/72.5
6,628,041 B2 * 9/2003 Lee .......... B81B 3/004
310/309

(Continued)

FOREIGN PATENT DOCUMENTS

DE    102008038184 A1    2/2010
DE    102008038186 A1    2/2010
(Continued)

OTHER PUBLICATIONS

Choi et al., Diamond-like carbon protective anti-reflection coating for Si solar cell, Materials Letters, 62, p. 577-580, 2008.*
(Continued)

*Primary Examiner* — Thomas F Valone
(74) *Attorney, Agent, or Firm* — Schwegman Lundberg & Woessner, P.A.

(57) ABSTRACT

The present invention relates to a bar for the electrical contacting of an electrically conductive substrate in the form of a thin, electrically conducting and resilient contact. The bar comprises a current-collecting bar on which a plurality of contact fingers is fitted. The invention is distinguished by the contact fingers being configured resiliently in the direction of the contact to be produced.

18 Claims, 4 Drawing Sheets

(51) Int. Cl.
  *G01R 1/073* (2006.01)
  *H02S 50/10* (2014.01)

(56) References Cited

U.S. PATENT DOCUMENTS

| | | |
|---|---|---|
| 2007/0068567 A1 | 3/2007 | Rubin et al. |
| 2009/0206287 A1* | 8/2009 | Trupke ............... G01N 21/6489 250/582 |
| 2009/0256583 A1 | 10/2009 | Chen et al. |
| 2010/0045264 A1* | 2/2010 | Kiesewetter ....... G01R 1/07342 324/149 |
| 2010/0045265 A1* | 2/2010 | Kiesewetter ...... H01L 31/02008 324/149 |

FOREIGN PATENT DOCUMENTS

| | | |
|---|---|---|
| EP | 0078339 A1 | 5/1983 |
| WO | WO-2006/026346 A1 | 3/2006 |

OTHER PUBLICATIONS

"International Application No. PCT/EP2012/000012, International Search Report and Written Opinion mailed Apr. 23, 2012", 16 pgs.

"International Application No. PCT/EP2012/000012, English Translation of International Preliminary Report on Patentability mailed Jul. 25, 2013", 10 pgs.

* cited by examiner

- Prior Art -

BAR FOR ELECTRONICALLY CONTACTING AN ELECTRICALLY CONDUCTIVE SUBSTRATE

PRIORITY CLAIM TO RELATED APPLICATIONS

This application is a national stage application under 35 U.S.C. §371 of PCT/EP2012/000012, filed Jan. 3, 2012, and published as WO 2012/095275 A1 on Jul. 19, 2012, which claims priority to German Application No. 10 2011 008 261.1, filed Jan. 11, 2011, which applications and publication are incorporated by reference as if reproduced herein and made a part hereof in their entirety, and the benefit of priority of each of which is claimed herein.

The present invention relates to a bar for the electrical contacting of an electrically conductive substrate in the form of a thin, electrically conducting and resilient contact. The bar comprises a current-collecting bar on which a plurality of contact fingers is fitted. The invention is distinguished by the contact fingers being configured resiliently in the direction of the contact to be produced.

For measurement of solar cells without cell connectors, the busbars or contact pads must be contacted electrically by contact pressure or low pressure. Thus, the cell can be flashed or its luminescence can be tested. These are important methods for qualitative and quantitative evaluation of solar cells.

To date, this problem has been solved by resilient contact pins. Manufacturers of these are for example Ingun Prüfmittelbau GmbH or Tekon Prüftechnik GmbH.

Figure 1:
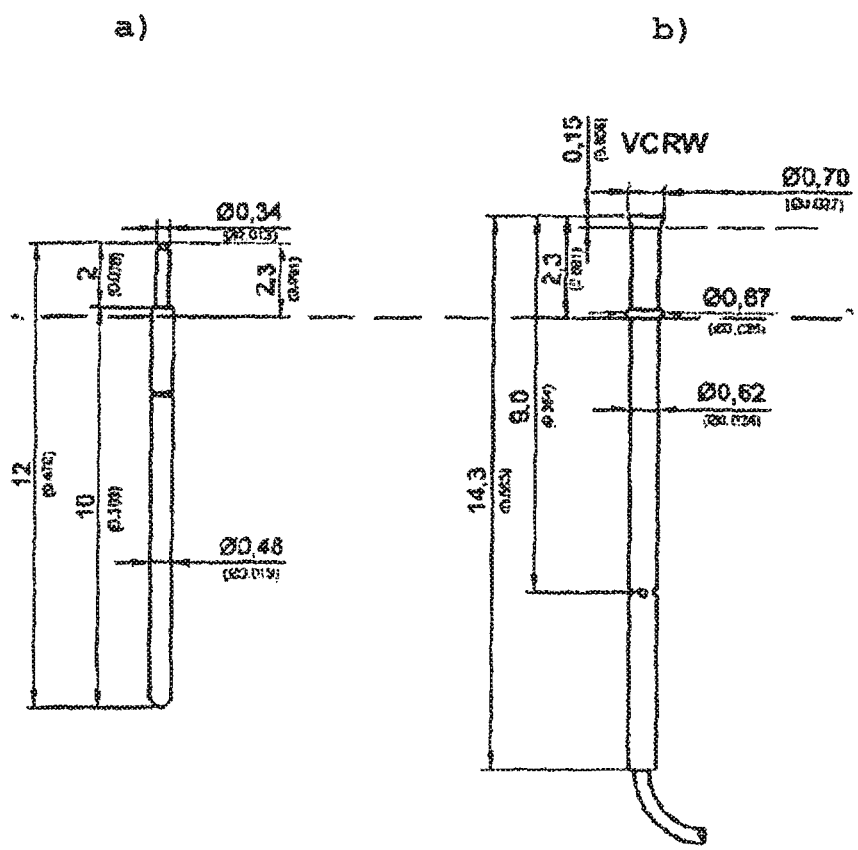

In FIG. 1a), a corresponding contact pin of the company Tekon (microcontact pin series 0006MC) is illustrated; FIG. 1b) shows a corresponding bush for this contact pin (series 0006MC) (source: Tekon Prüfmitteltechnik GmbH: contacts pins catalogue 2009, Weinstadt).

Such contact pins are used for electrical contacting of for example solar cells in order to ascertain parameters of these solar cells which are determined for example via flasher measurements (flasher) or photo- or electroluminescence measurements. The solar cells are thereby contacted electrically with the contact pins for example via their busbars. Typical busbar widths are thereby between 1.5 and 2.4 mm. Because of their design, such contact pins along the busbar mask however a part of the solar cell because of their width so that the result with the above-described testing methods is in part falsification of the obtained measuring values or results.

A probe head arrangement for conductive course testing which has at least one probe head which has a large number of resilient contacts is known from EP 0 078 339. The resilient contacts thereby have a certain flexibility so that a resilient effect is achieved, with lateral application of the probe head on the substrate to be contacted, by bending of the contacts. Such a probe head arrangement is however possibly unsuitable for the above-mentioned testing methods of solar cells since, due to the lateral arrangement, a large-area shading of the solar cell is effected so that the solar cell can be neither irradiated efficiently with light nor, in the case of corresponding luminescence measurements, can the luminescence be completely recorded. Such a probe head arrangement also therefore leads to falsification of the results achieved with the above-mentioned testing methods. Furthermore, vertical contacting of the solar cell with the probe head arrangement is likewise not advantageous since the contacts have a resilient effect which would be developed in the corresponding plane which forms the probe head. In the case of a corresponding vertical contacting of a solar cell with such a probe head, the result would accordingly be damage or even destruction of the solar cell to be tested in the case of specific contact pressures.

US 2007/0068567 A1 relates to a device for temporary electrical contacting of a solar cell, which can be configured inter alia such that an electrical conductor which is fixed to a continuously configured block is mounted on a bar via a plurality of resilient elements. However, it is disadvantageous with such an embodiment that, for example in the case where uneven portions are present on the surface of the solar cell, partial lifting of the electrical contact from the surface of the solar cell to be contacted consequently takes place and as a result merely partial contacting of the solar cell is effected. Consequently, the obtained measuring results are also falsified, the contact device described here is likewise fairly unsuitable for reliable contacting of a solar cell.

A probe for temporary electrical contacting of a solar cell for testing purposes is known also from DE 10 2008 038 186 A1, which probe has a plurality of contact elements which are disposed adjacently on a bar in the manner of a comb. With this device also, merely a resilient effect which extends from the plane of the bar can be recorded; the spiral springs have however a rigid configuration in the direction of the contact to be produced. Hence disadvantages are also involved here, as were also described already above in the case of the contact elements of EP 0 078 339.

Starting herefrom, it is therefore the object of the present invention to indicate a bar for temporary contacting of for example solar cells, with which the above-mentioned disadvantages can be avoided.

This object is achieved, with respect to the bar, the production method of the bar, and with respect to the testing method of a solar cell described herein.

According to the invention, a bar for the electrical contacting of an electrically conductive substrate is hence provided, which bar comprises a current-collecting bar which has an elongated configuration in the x-direction and has a certain thickness in the y-direction and which bar comprises a plurality of contact fingers which are disposed on the current-collecting bar on one side and have a directional component in the direction of the contacting to be produced (z-direction), the current-collecting bar and the contact fingers being integrally formed. It is thereby essential to the invention that the contact fingers are configured resiliently in the z-direction.

The solution according to the invention hence comprises a bar which is divided in principle into two functional units, namely a current-collecting bar which is preferably configured continuously and also contact fingers which start from this current-collecting bar on one side and are connected electrically to the current-collecting bar. The current-collecting bar serves not only for current conduction but in addition for mechanical stabilisation of the contact bar against forces from outside. The bar according to the invention thereby has dimensioning in which the bar has an elongated configuration (x-direction); the depth or thickness of the current-collecting bar is defined as y-direction. The direction in which contacting of the bar with a substrate is intended to be effected, for example a solar cell (and in which the contact fingers branch off from the current-collecting bar) is defined as z-direction. It is now essential to the invention that each of the contact fingers is designed such that a resilient effect is provided in the z-direction so that, upon contacting of the bar with a substrate to be contacted, e.g. by the bar being brought in contact in the z-direction with the substrate to be contacted with the contact fingers via the tips of the contact fingers, a spring mounting and consequently reduction in the acting contact pressure force is provided.

This has the advantage, on the one hand, that a large number of contact points can be produced on the solar cell itself. On the other hand, because of the resilient effect of each contact, an excess force effect on the solar cell surface and hence damage or even destruction of the solar cell can be counteracted on a long-term basis. Furthermore, it has proved to be advantageous that, in particular in the case where the bar has an extremely small dimensioning in the y-direction, i.e. a small thickness, a large-area shading of the solar cell can be avoided. Hence essentially undisturbed light incidence on the solar cell (in z-direction) is ensured, but also, e.g. in the case of a photo- or electroluminescence measurement, an extensively unimpeded light emission (likewise in z-direction) from the solar cell is ensured.

In contrast to the solution quoted in the above-quoted EP 0 078 339, the present invention provides a geometry of the individual fingers which develop a resilient effect in the plane of the metal sheet (z-direction). Consequently, a vertical contact pressure on the testpiece, for example a solar cell, is possible with minimal shading. In contrast to US 2007/0068567, the solution according to the invention is distinguished by elastic fingers processed from the film. In contrast to the probe known from DE 10 2008 038 186, the probe according to the invention is produced in one part, therefore consists hence not of individual parts and is therefore much easier to produce, flatter with respect to shading and denser finger spacings can be produced.

Particularly preferred embodiments of the bar according to the invention are described subsequently.

It is advantageous for example if the resilient configuration of the contact fingers is caused by the angle which is formed between the x-direction and the course of the contact fingers being between 10° and 70°, preferably between 15° and 50°, further preferred between 20° and 40°, particularly preferred between 25° and 35°. According to this embodiment, the contact fingers are fitted angled-off with respect to the current-collecting bar. The angling-off is thereby effected however in the x-/z-direction so that the course of the contact fingers in the z-direction is masked essentially completely or completely by the current-collecting bar. The bar is therefore configured likewise very thinly in projection in the z-direction. Upon contact pressure in the z-direction of the bar on the substrate to be contacted, further bending of the contact fingers is effected by the angled-off arrangement of the contact fingers, as a result of which the resilient effect is provided.

Alternatively or additionally hereto, the resilient configuration of the contact fingers can be effected by the contact fingers having a non-linear course, in particular a curved or arcuate course.

According to this embodiment, it is provided that the resilient effect can be effected by a non-linear course of the contact fingers. In a particularly preferred embodiment, the curved or arcuate course of the contact fingers is configured such that the contact fingers are likewise masked by the current-collecting bar in projection in the z-direction, i.e. the curved or arcuate course of the contact fingers is fixed in the x-/z-plane of the bar.

Furthermore, it is advantageous if the tips of the contact fingers have a rounded and/or flattened configuration. By rounding the tips, a more planar contact can be ensured and hence the contact resistance can be reduced.

In addition, it is provided according to a further advantageous embodiment that the contact fingers are disposed parallel and/or equidistant.

It is likewise preferred if the spacing of the contact fingers relative to each other is less than 2 mm, preferably less than 1 mm, particularly preferred between 0.05 and 0.5 mm, in particular between 0.12 and 0.15 mm.

Furthermore, it is advantageous if the length of all the contact fingers is equal.

In a further advantageous embodiment,
a) the length of the contact fingers is between 10 and 50 mm, preferably between 15 and 30 mm, particularly preferred between 20 and 25 mm and/or
b) the width of the contact fingers in the x-direction is between 0.05 and 2.0 mm, preferably between 0.1 and 1.0 mm, particularly preferred between 0.15 and 0.6 mm.

Furthermore, it is preferred if the bar has a very narrow configuration, i.e. that the current-collecting bar and/or the contact fingers have a thickness in the y-direction of less than 1.0 mm, preferably less than 0.5 mm, particularly preferred between 0.05 and 0.3 mm, in particular between 0.08 and 0.15 mm. The current-collecting bar in the y-direction thereby preferably has the same dimensioning as the contact fingers. Both regions of the bar according to the invention are configured for example as film of equal thickness with a thickness for example of 0.1 mm.

A further embodiment of the bar provides that it comprises over 5 to 500, preferably over 10 to 200 contact fingers.

With respect to possible materials, it is advantageous if the current-collecting bar and also the contact fingers are formed from an electrically conductive material, in particular a metal, such as e.g. copper, silver and/or alloys hereof, and also alloys comprising copper and beryllium.

Furthermore, it is possible if at least the contact fingers, at least in regions, in particular at least in the region of the contact points, have an electrically conductive coating, in particular a gold coating.

From the point of view of production technology, it is particularly preferred if the current-collecting bar and the contact fingers are configured in one part.

Figure 4:
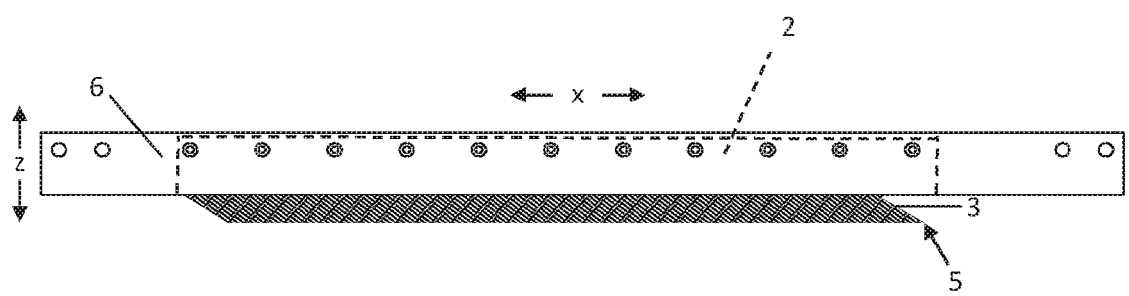

A further embodiment of the present invention, shown in FIG. 4, provides that the current-collecting bar 2 is reinforced for mechanical stabilisation in the y-direction by at least one electrically conductive plate 6 which is connected to the current-collecting bar 2 in a form fit and/or frictionally, preferably by two electrically conductive plates which are connected on both sides in the y-direction to the current-collecting bar in a form fit and/or frictionally. The connection of the electrical conductive plate 6 connected to the bar 2 in a form fit or frictionally can thereby be effected for example by soldering or gluing, but also by mechanical connections, such as for example screws or rivets. The plate or the plates 6 thereby serve for mechanical reinforcement of the bar 2 according to the invention, in particular in the region of the current-collecting bar.

It is thereby advantageous if the plate or the plates 6 have a thickness in the y-direction between 0.1 and 2 mm, preferably between 0.3 and 0.5 mm. In particular, the plate or the plates 6 are thereby formed from the same material as the bar 2. Reference is made in this respect to the above-mentioned material selection.

It is particularly preferred if the bar is covered, at least in regions, with the exception of the regions which serve for electrical contacting, with a protective layer and/or a reflection-reducing layer, in particular a layer of paint. In particular, there are used for this purpose emissivity paints, for example the product TETNAL® or the product SENO-THERM® of the company InfraTech GmbH.

According to the invention, a method for the production of an above-described bar is likewise indicated, in which material is removed from a blank, e.g. a plate, for the bar by means of a material removal step so that the arrangement of the contact fingers is produced. As blank for the bar according to the invention, there is possible for example a material strip formed correspondingly from a conductive material or a corresponding plate with an elongated extension (x-direction), extension in width (z-direction) and also a certain thickness (y-direction). In the region of the blank in which the contact fingers are intended to be produced, a separation of the blank in the x-/y-plane is now undertaken in regions so that contact fingers which are separated from each other are produced in the x-/z-direction. In the region in which the current-collecting bar is intended to be formed, the blank is not machined. However, additional separations in this region, e.g. borings etc., can however be introduced also into the material strip in order for example to fix reinforcing plates to the current-collecting bar. All previously described preferred geometric configurations of the contact fingers can be effected by the method according to the invention.

The material removal can thereby be effected directly, for example by the process taking place with corresponding laser ablation methods or mechanical material removal methods, the material removal can likewise be effected by corresponding etching methods. For this purpose, the blank is provided for example with a corresponding etching mask which is left open at the places at which the material removal is intended to take place.

Furthermore, a method for testing a solar cell is indicated according to the invention, in the case of which a solar cell is contacted electrically by at least two previously-described bars via the contact fingers by an electrical contacting of the busbars being undertaken, and subsequently the solar cell is flashed and/or excited to photoluminescence and/or to electroluminescence and/or measured. At least one pair of bars is thereby required for electrical contacting of a solar cell. The bars are contacted with the solar cell such that the tips of the contact fingers are brought in contact with the substrate, i.e. the solar cell. Preferably, the bar is arranged on the solar cell such that the shading of the solar cell by the bar is as minimal as possible.

In the case of solar cells which have for example two busbars, contacting of the solar cell can also be effected by means of three of the bars according to the invention. For example each of the two busbars present on the front-side can thereby be contacted with respectively one bar, in addition also the rear-side contact of the solar cell is contacted with a corresponding bar.

An analogous procedure is likewise conceivable for solar cells with three busbars, here also each of the busbars can be contacted with respectively one contact bar.

The present invention is described in more detail with reference to the subsequently represented embodiments and also the accompanying Figure without restricting the invention to the special embodiments represented there.

Figure 2:
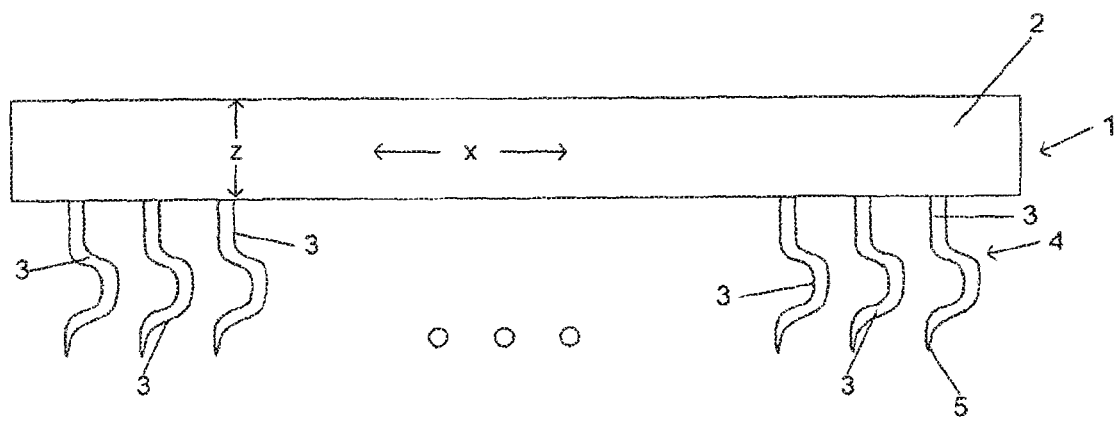

In FIG. 2, a first embodiment according to the invention of the bar 1 according to the invention, which is formed from a current-collecting bar 2 and also a plurality of contact fingers 3 disposed on one side on the current-collecting bar 2 is represented. The bar 1 thereby has an elongated dimensioning (x-direction, illustrated in the Figure) and also a corresponding dimensioning in the z-direction (likewise indicated in the Figure by the corresponding directional vector). The dimensioning (thickness) of the bar 1 in the y-direction is not illustrated; this extends in the drawing plane. The resilient effect of the spring contacts in the z-direction is now effected by each of the contact fingers 3 having a non-linear course, in the present case for example in the form of an arcuate recess or a curved region 4. If such a bar is now contacted electrically with a substrate to be contacted in the z-direction via the tips 5 of the contact fingers 3, the force acting on the contact fingers or the substrate to be contacted can be absorbed by each of the contact fingers 3 being able to deform more easily due to the preset curve 4.

Figure 3:
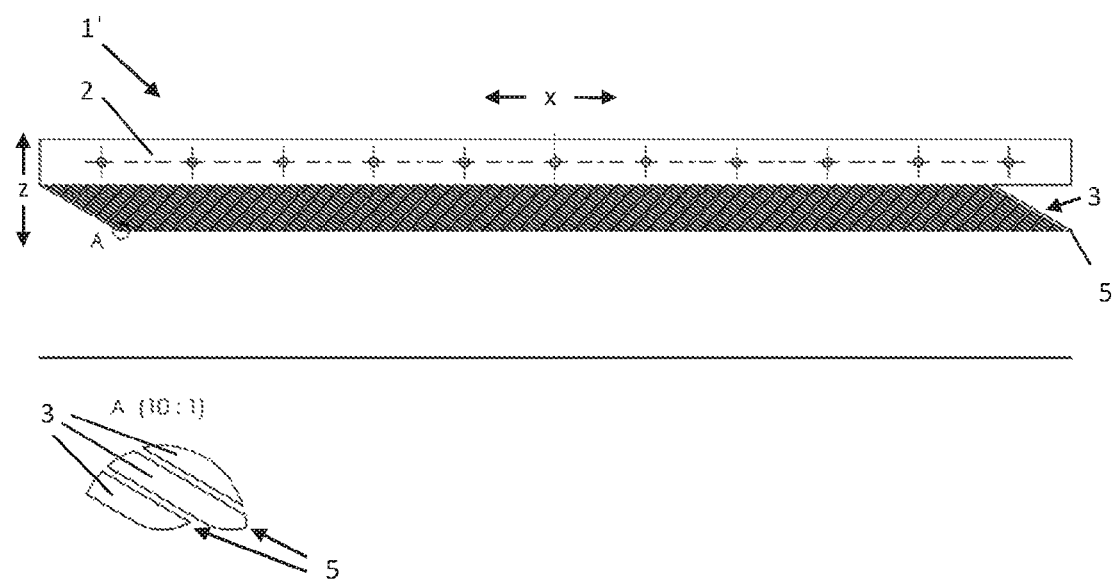

In FIG. 3, a further embodiment of the bar 1' according to the present invention is illustrated. Here also, a current-collecting bar 2 on which a plurality of contact fingers 3 is disposed on one side is provided. Both the current-collecting bar 2 and the contact fingers 3 branching off herefrom are thereby configured in the x-/z-plane illustrated in FIG. 3. The bar 1 has altogether a certain thickness which extends in the drawing plane (y-direction, not illustrated). The resilient effect of such an embodiment according to the invention of the bar 1 is effected by the contact fingers 3 being disposed at a certain angle which is less than 90°, relative to the x-direction of the current-collecting bar 2 on the latter. As a result of this angled-off course of the contact fingers 3 with respect to the current-collecting bar 2, a resilient effect can be produced likewise upon contacting of the bar 1 with a substrate to be contacted via the tips 5 of the contact fingers 3 by corresponding force absorption and deformation of the contact fingers 3. The resilient effect can be influenced via the angle. A smaller angle increases the resilient effect.

The previously described contact bars reduce the measurement deviation due to the serial resistance of the busbar. Furthermore, these reduce the shading of the cell. With an equal number of contact points, contacting via the contact bar is more favourable relative to contacting with contact pins. In addition, flexibility can be achieved in the arrangement of the cell-side contact pad in a simple manner.

For the contacting, for example an etched and electrically conductive material with an Au layer is used. For mechanical stabilisation of this film, this is soldered to one or more thin and electrically conductive metal sheets, preferably made of the same material as the bar. Since these metal sheets increase the cross-section of the current guide, the voltage drop over the bar is reduced. As a result of the fact that very thin materials are used, the contacting turns out to be thinner than conventional contacting variants. If the contacting is wider than the busbar, a part of the solar cell is shaded. This falsifies the measuring result and, in the case of the shadow which is cast in the EL, leads to a loss of information.

With the help of this invention, solar cells can be contacted electrically without (or with) cell connectors and examined for example by EL or flashers.

In addition to the material cost advantage, the contact bar, relative to conventional contacting variants, reduces the shading and, as a result of the densely situated contact points, the measurement error due to the serial resistance of the busbar.

The invention claimed is:

1. A bar for the electrical contacting of an electrically conductive substrate, the bar comprising:
   a current-collecting bar having an elongated configuration in an x-direction, a thickness in a y-direction, and a plurality of contact fingers disposed on one side of the current-collecting bar, the plurality of contact fingers having a directional component in a z-direction, the z-direction being a direction of contacting, the current-collecting bar and the contact fingers being integrally formed, wherein the contact fingers are configured resiliently in the z-direction and have at least one of: a) a length of the contact fingers between 10 and 50 mm b) a width of the contact fingers in the x-direction between 0.05 and 2.0 mm.

2. A bar for the electrical contacting of an electrically conductive substrate, the bar comprising:
    a current-collecting bar having an elongated configuration in the an x-direction, a thickness in a y-direction, and a plurality of contact fingers disposed on one side of the current-collecting bar, the plurality of contact fingers having a directional component in a z-direction, the z-direction being a direction of contacting, the current-collecting bar and the contact fingers being integrally formed,
    wherein the contact fingers are configured resiliently in the z-direction and the current-collecting bar is reinforced for mechanical stabilization in the y-direction by at least one electrically conductive plate connected to the current-collecting bar in at least one of a form fit and a frictional fit and the at least one electrically conductive plate has a thickness in the y-direction between 0.1 and 2 mm.

3. A method for the production of a bar for electrical contacting of an electrically conductive substrate, the bar comprising a current-collecting bar having an elongated configuration in the an x-direction, a thickness in a y-direction, and a plurality of contact fingers disposed on one side of the current-collecting bar, the plurality of contact fingers having a directional component in a z-direction, the z-direction being a direction of contacting, the current-collecting bar and the contact fingers being integrally formed, wherein the contact fingers are configured resiliently in the z-direction and have at least one of: a) a length of the contact fingers between 10 and 50 mm b) a width of the contact fingers in the x-direction between 0.05 and 2.0 mm or the current-collecting bar is reinforced for mechanical stabilization in the y-direction by at least one electrically conductive plate connected to the current-collecting bar in at least one of a form fit and a frictional fit and the at least one electrically conductive plate has a thickness in the y-direction between 0.1 and 2 mm, the method comprising a material removal step to form the plurality of contact fingers, the material removal step including at least one of an etching process, laser ablation, and mechanical material removal.

4. A method for testing a solar cell, the method comprising:
    electrically contacting a solar cell to an electrically conductive substrate by at least two bars, each of the at least two bars comprising a current-collecting bar having an elongated configuration in an x-direction, a thickness in a y-direction, and a plurality of contact fingers disposed on one side of the current-collecting bar, the plurality of contact fingers having a directional component in a z-direction, the z-direction being a direction of contacting, the current-collecting bar and the contact fingers being integrally formed, wherein the contact fingers are configured resiliently in the z-direction and have at least one of: a) a length of the contact fingers between 10 and 50 mm b) a width of the contact fingers in the x-direction between 0.05 and 2.0 mm or the current-collecting bar is reinforced for mechanical stabilization in the y-direction by at least one electrically conductive plate connected to the current-collecting bar in at least one of a form fit and a frictional fit and the at least one electrically conductive plate has a thickness in the y-direction between 0.1 and 2 mm,
    wherein contacting the solar cell to the electrically conductive substrate is via an electrical contact of busbars by the contact fingers, and
    subsequently, at least one of flashing the solar cell, exciting the solar cell to at least one of photoluminescence and/or to electroluminescence, and measuring the solar cell.

5. The bar according to either one of claims 1 or 2, wherein an angle formed between the x-direction and the contact fingers is between 10° and 70°.

6. The bar according to either one of claims 1 or 2, wherein the contact fingers have a non-linear course.

7. The bar according to either one of claims 1 or 2, wherein tips of the contact fingers have at least one of a rounded configuration and a flattened configuration.

8. The bar according to either one of claims 1 or 2, wherein the contact fingers are at least one of parallel and equidistant.

9. The bar according to either one of claims 1 or 2, wherein a spacing of the contact fingers relative to each other is less than 2 mm.

10. The bar according to either one of claims 1 or 2, wherein a length of all the contact fingers is equal.

11. The bar according to either one of claims 1 or 2, wherein one or both of the current-collecting bar and the contact fingers have a thickness in the y-direction of less than 1.0 mm.

12. The bar according to either one of claims 1 or 2, wherein the current-collecting bar comprises 5 to 500 contact fingers.

13. The bar according to either one of claims 1 or 2, wherein the current-collecting bar and the contact fingers are formed from an electrically conductive material.

14. The bar according to either one of claims 1 or 2, wherein at least a portion of the contact fingers have an electrically conductive coating.

15. The bar according to claim 14, wherein the electrically conductive coating comprises a gold coating.

16. The bar according to either one of claims 1 or 2, wherein the bar is covered in at least a portion of regions that do not serve for electrical contacting with at least one of a protective layer and a reflection-reducing layer.

17. The bar according to either one of claims 1 or 2, wherein the resilient configuration of the contact fingers is caused by the contact fingers having a curved or an arcuate course.

18. The bar according to either one of claims 1 or 2, wherein the current-collecting bar and the contact fingers are formed from a metal comprising at least one of copper, silver, alloys comprising at least one of copper and silver, and alloys comprising copper and beryllium.

* * * * *